United States Patent
Jeannin et al.

(10) Patent No.: US 11,489,088 B2
(45) Date of Patent: Nov. 1, 2022

(54) METHOD FOR MANUFACTURING AN OPTOELECTRONIC DEVICE WITH SELF-ALIGNING LIGHT CONFINEMENT WALLS

(71) Applicant: ALEDIA, Grenoble (FR)

(72) Inventors: Olivier Jeannin, Grenoble (FR); Erwan Dornel, Champagnier (FR); Eric Pourquier, Grenoble (FR); Tiphaine Dupont, Grenoble (FR)

(73) Assignee: ALEDIA, Grenoble (FR)

( * ) Notice: Subject to any disclaimer, the term of this patent is extended or adjusted under 35 U.S.C. 154(b) by 16 days.

(21) Appl. No.: 17/253,506

(22) PCT Filed: Jun. 19, 2019

(86) PCT No.: PCT/FR2019/051502
§ 371 (c)(1),
(2) Date: Dec. 17, 2020

(87) PCT Pub. No.: WO2019/243743
PCT Pub. Date: Dec. 26, 2019

(65) Prior Publication Data
US 2021/0265534 A1 Aug. 26, 2021

(30) Foreign Application Priority Data
Jun. 19, 2018 (FR) ...................... 18/55401

(51) Int. Cl.
*H01L 33/06* (2010.01)
*H01L 33/38* (2010.01)
(Continued)

(52) U.S. Cl.
CPC ............ *H01L 33/06* (2013.01); *H01L 25/167* (2013.01); *H01L 27/156* (2013.01);
(Continued)

(58) Field of Classification Search
CPC ..... H01L 27/156; H01L 33/42; H01L 33/465; H01L 33/502; B82Y 40/00; B82Y 20/00
See application file for complete search history.

(56) References Cited

U.S. PATENT DOCUMENTS

| | | | |
|---|---|---|---|
| 8,624,968 B1 * | 1/2014 | Hersee | G02B 21/0004 382/128 |
| 9,299,882 B2 | 3/2016 | Cagli | |

(Continued)

FOREIGN PATENT DOCUMENTS

| | | |
|---|---|---|
| FR | 3000298 A1 | 6/2014 |
| WO | 2018002251 A1 | 1/2018 |
| WO | 2018002485 A1 | 1/2018 |

OTHER PUBLICATIONS

English Translation to International Search Report for Application No. PCT/FR2019/051502.

(Continued)

*Primary Examiner* — Mark W Tornow
(74) *Attorney, Agent, or Firm* — Cantor Colburn LLP

(57) ABSTRACT

There is described an optoelectronic device where each light-emitting diode has a wire-like shape. Spacing walls are formed so that the lateral sidewalls of each light-emitting diode are surrounded by at least one of the spacing walls. Light confinement walls directly cover the lateral sidewalls of the spacing walls by being in contact with the latter. The spacing walls have a convex-shaped outer face. At least one of the spacing walls has, over a lower portion, a thickness that increases when getting away from the substrate. They have, over an upper portion, a thickness that decreases at the level of the upper border of the light-emitting diode when getting away from the substrate. The light confinement walls have an inner face having a concave shape matching with the (Continued)

convex shape and directed towards the light-emitting diode for which it confines the light radiation thereof.

20 Claims, 4 Drawing Sheets

(51) Int. Cl.
| | |
|---|---|
| *H01L 33/60* | (2010.01) |
| *H01L 33/42* | (2010.01) |
| *H01L 33/46* | (2010.01) |
| *H01L 33/50* | (2010.01) |
| *H01L 33/10* | (2010.01) |
| *H01L 33/20* | (2010.01) |
| *H01L 25/16* | (2006.01) |
| *H01L 27/15* | (2006.01) |
| *H01L 33/00* | (2010.01) |
| *B82Y 20/00* | (2011.01) |
| *B82Y 40/00* | (2011.01) |

(52) U.S. Cl.
CPC ........ *H01L 33/005* (2013.01); *H01L 33/0075* (2013.01); *H01L 33/10* (2013.01); *H01L 33/20* (2013.01); *H01L 33/382* (2013.01); *H01L 33/42* (2013.01); *H01L 33/465* (2013.01); *H01L 33/502* (2013.01); *H01L 33/60* (2013.01); *B82Y 20/00* (2013.01); *B82Y 40/00* (2013.01); *H01L 2933/0025* (2013.01); *H01L 2933/0041* (2013.01)

(56) References Cited

U.S. PATENT DOCUMENTS

| | | | |
|---|---|---|---|
| 11,275,238 B2* | 3/2022 | Grandclerc | ......... H01L 27/1214 |
| 2017/0373118 A1* | 12/2017 | Hugon | ................... H01L 33/62 |
| 2018/0366515 A1* | 12/2018 | Hugon | ................... H01L 33/28 |
| 2019/0165040 A1 | 5/2019 | Dupont et al. | |

OTHER PUBLICATIONS

International Search Report for Application No. PCT/FR2019/051502.

Written Opinion for Application No. PCT/FR2019/051502.

* cited by examiner

METHOD FOR MANUFACTURING AN OPTOELECTRONIC DEVICE WITH SELF-ALIGNING LIGHT CONFINEMENT WALLS

CROSS REFERENCE TO RELATED APPLICATIONS

This application is a National Stage of PCT Application No. PCT/FR2019/051502 filed on Jun. 19, 2019, which claims priority to French Patent Application No. 18/55401 filed on Jun. 19, 2018, the contents each of which are incorporated herein by reference thereto.

TECHNICAL FIELD

The present invention concerns a method for manufacturing an optoelectronic device including an array of light-emitting diodes, including the following steps:
- formation of the array of light-emitting diodes on a support face of a substrate, this step being carried out so that each light-emitting diode has an elongate wire-like shape according to a longitudinal axis extending according to a transverse direction of the optoelectronic device directed transversely to the support face of the substrate,
- formation of spacing walls made of a first dielectric material transparent to the light radiation originating from the light-emitting diodes, the formed spacing walls being such that the lateral sidewalls of each light-emitting diode, over the entire height thereof considered according to the transverse direction, are surrounded by at least one of the spacing walls,
- formation of light confinement walls made of a second material adapted to block the light radiation originating from the light-emitting diodes, the formed light confinement walls directly covering the lateral sidewalls of the spacing walls by being in contact with the latter, so that the light radiation originating from each light-emitting diode and directed in the direction of the adjacent light-emitting diodes is blocked by the light confinement wall which covers the spacing wall that surrounds said light-emitting diode.

The invention also concerns an optoelectronic device comprising:
- an array of light-emitting diodes where each light-emitting diode has an elongate wire-like shape according to a longitudinal axis extending according to a transverse direction of the optoelectronic device,
- spacing walls made of a first dielectric material transparent to the light radiation originating from the light-emitting diodes and arranged such that the lateral sidewalls of each light-emitting diode, over the entire height thereof considered according to the transverse direction, are surrounded by at least one of the spacing walls,
- and light confinement walls made of a second material adapted to block the light radiation originating from the light-emitting diodes, the light confinement walls directly covering the lateral sidewalls of the spacing walls by being in contact with the latter, the light radiation originating from each light-emitting diode and directed in the direction of the adjacent light-emitting diodes being blocked by the light confinement wall which covers the spacing wall that surrounds said light-emitting diode.

The invention finds application in particular in display screens or images projection systems.

BACKGROUND

By optoelectronic device, it should be understood herein a device adapted to perform the conversion of an electrical signal into an electromagnetic radiation to be emitted, in particular light.

There are optoelectronic devices including light-emitting diodes, also known under the acronym LED, formed on a substrate.

It is known that each light-emitting diode comprises an active material exploiting quantum wells, a semiconductor portion doped according to a first doping type to serve as a P-doped junction and a semiconductor portion doped according to a second doping type to serve as an N-doped junction.

Each light-emitting diode may be formed based on semiconductor three-dimensional elements which, in turn, are at least partially obtained by epitaxial growth. The light-emitting diodes are typically formed based on a semiconductor material comprising for example elements from the column III and column V of the periodic table of elements, such as a III-V compound, in particular gallium nitride (GaN), indium and gallium nitride (InGaN) or aluminum and gallium nitride (AlGaN).

There are optoelectronic devices including an array of light-emitting diodes having a determined emission surface throughout which is transmitted the light radiation emitted by the light-emitting diodes. In particular, such optoelectronic devices may be used in the making of display screens or images projection systems, where the array of light-emitting diodes actually defines an array of light pixels where each pixel includes one or several light-emitting diode(s).

One of the difficulties relates to how to ensure that the light radiation emitted by a light-emitting diode does not mix with the light radiation emitted by the adjacent light-emitting diodes in order to improve contrasts. In particular, one problem is how to ensure that diaphotic colors excitations between the sub-pixels are avoided, which phenomenon is also known by the name «cross-talk» in the considered technical field. Yet, this problem turns out to be even more difficult to solve given the ever-increasing miniaturization of the light-emitting diodes.

A known solution consists in forming light confinement walls adapted to block the transmission of the light radiation emitted by one or several given light-emitting diode(s) towards one or several adjacent light-emitting diode(s).

A known technique for forming such light confinement walls consists in depositing a resin layer over the light-emitting diodes, the resin being photolithographed while complying with a pattern guaranteeing the presence of trenches intended to be filled afterwards with a material, for example through a growth or deposition technique, adapted to block the light radiation and even ensure a reflection of the latter This technique has the drawback that it is difficult to follow an accurate alignment between the confinement walls and the light-emitting diodes. This problem is even more severe given the ever-increasing miniaturization of the light-emitting diodes in order to ultimately achieve a high resolution.

The document FR3000298A1 describes a solution in which a negative resin that is photosensitive in the emission wavelengths range of the photoconductor nanowires is deposited by covering the nanowires. With this negative resin type, in the exposed areas, the photons react with the photosensitive negative resin and degrade the solubility properties thereof, the resin becoming less soluble. Afterwards, selective patterns may be uncovered in a developer (typically a basic aqueous solution); indeed, the areas of the resin that are less soluble in the developer thus subsist at the surface of the substrate, the remainder being solubilized in the developer. The resin may be selected so as to be capable of self-conforming, that is to say conforming the closest to the shape of the nanowires. The self-conformation of the resin allows leaving gaps between two adjacent nanowires. Then, it is proceeded with a step of depositing an ink into said gaps, thereby allowing defining adsorbent patterns of an adsorbent material in the sensitivity wavelengths range of the nanowires. Then, the nanowires are activated by current injection from control pads. It is the illumination generated by the nanowires which allows achieving the insulation, or not, of the different portions within the resin. The interest of the adsorbent ink, and thus of the patterns in the gaps, relates to the fact that the resin that encapsulates a defective nanowire is prevented from being illuminated by a contiguous nanowire. Then, a step is implemented during which the resin is developed at the level of the defective nanowires, leaving areas that are made less soluble and surrounding only the active nanowires. Then, the conductive layer that is present on top of the defective nanowires is removed.

But this solution, given the steps and techniques required thereby, is not yet optimal and is not fully satisfactory. It is complex to implement, expensive, and remains restrictive with regards to the used techniques and materials.

Besides, the techniques that are currently implemented do not allow achieving enough collimation of the emitted light for some applications. In particular, they do not allow obtaining a satisfactory light beam opening. This is true especially in the case of wire-like shaped light-emitting diodes which, nevertheless, still have many advantages.

In this context, there is a need to provide a method for manufacturing an optoelectronic device that is simple, effective and allowing increasing the resolution while optimizing the contrast.

BRIEF SUMMARY

The present invention aims at providing a manufacturing method for manufacturing an optoelectronic device comprising an array of light-emitting diodes which allows obtaining high-resolution and high-contrast optoelectronic devices in a simple, economical, effective and non-limiting way, while allowing obtaining a very good collimation of the light emitted by the light-emitting diodes.

This object can be achieved thanks to the implementation of a method for manufacturing an optoelectronic device including an array of light-emitting diodes, including the following steps:

formation of the array of light-emitting diodes on a support face of a substrate, this step being carried out so that each light-emitting diode has an elongate wire-like shape according to a longitudinal axis extending according to a transverse direction of the optoelectronic device directed transversely to the support face of the substrate, formation of spacing walls made of a first dielectric material transparent to the light radiation originating from the light-emitting diodes, the formed spacing walls being such that the lateral sidewalls of each light-emitting diode, over the entire height thereof considered according to the transverse direction, are surrounded by at least one of the spacing walls, formation of light confinement walls made of a second material adapted to block the light radiation originating from the light-emitting diodes, the formed light confinement walls directly covering the lateral sidewalls of the spacing walls by being in contact with the latter, so that the light radiation originating from each light-emitting diode and directed in the direction of the adjacent light-emitting diodes is blocked by the light confinement wall which covers the spacing wall that surrounds said light-emitting diode, wherein the step of forming the spacing walls is implemented so that the formed spacing walls have a convex-shaped outer face and so that at least one of said spacing walls has, over a lower portion of the height thereof considered according to the transverse direction located on the side of the support face of the substrate, a thickness considered transversely to the longitudinal axis of the light-emitting diode surrounded thereby which increases when getting away from the support face of the substrate according to the transverse direction and which has, over an upper portion of the height thereof located on the side opposite to the support face of the substrate with respect to said lower portion, a thickness considered transversely to the longitudinal axis of the light-emitting diode surrounded thereby which decreases at the level of the upper border of the light-emitting diode when getting away from the support face of the substrate according to the transverse direction and wherein the formed light confinement walls have an inner face having a concave shape matching with said convex shape and directed towards the light-emitting diode for which it confines the light radiation thereof.

Some preferred, yet non-limiting, aspects of this manufacturing method are as follows.

The step of forming the spacing walls comprises a step of depositing a thin layer of the first material, implemented so that the deposited thin layer covers the lateral sidewalls and the upper border of the light-emitting diodes.

The second material used in the step of forming the light confinement walls is such that the light confinement walls are reflective for the light radiation originating from the light-emitting diodes.

The step of forming light confinement walls comprises a step of depositing a thin layer of the second material implemented so that this thin layer of the second material directly covers the lateral sidewalls of the spacing walls by being in contact with the latter and covers the upper border of the light-emitting diodes and in that the step of depositing the thin layer of the second material comprises a step of filling, by said thin layer of the second material, the empty spaces delimited between the spacing walls at the level of the areas between the light-emitting diodes.

At the end of the step of forming the light confinement walls, the upper border of each light-emitting diode is not covered by the second material so that the light radiation originating from the light-emitting diodes is emitted out of the optoelectronic device by an emission surface of the optoelectronic device located, with respect to the light-emitting diodes, on the side of the upper borders of the light-emitting diodes according to the transverse direction.

At the end of the step of forming the light confinement walls, the upper border of each light-emitting diode is covered by a light confinement wall so that after the implementation of a step of removing the substrate, the light radiation originating from the light-emitting diodes is emitted out of the optoelectronic device by an emission surface of the optoelectronic device located, with respect to the light-emitting diodes, on the side opposite to the upper borders of the light-emitting diodes according to the transverse direction.

The first material used for the formation of the spacing walls includes photo-luminescent particles which are in the form of quantum dots.

The invention also relates to an optoelectronic device comprising:
- an array of light-emitting diodes where each light-emitting diode has an elongate wire-like shape according to a longitudinal axis extending according to a transverse direction of the optoelectronic device,
- spacing walls made of a first dielectric material transparent to the light radiation originating from the light-emitting diodes and arranged such that the lateral sidewalls of each light-emitting diode, over the entire height thereof considered according to the transverse direction, are surrounded by at least one of the spacing walls,
- and light confinement walls made of a second material adapted to block the light radiation originating from the light-emitting diodes, the light confinement walls directly covering the lateral sidewalls of the spacing walls by being in contact with the latter, the light radiation originating from each light-emitting diode and directed in the direction of the adjacent light-emitting diodes being blocked by the light confinement wall which covers the spacing wall that surrounds said light-emitting diode, wherein the spacing walls have a convex-shaped outer face, at least one of said spacing walls having, over a lower portion of the height thereof considered according to the transverse direction located on the side of the support face of the substrate, a thickness considered transversely to the longitudinal axis of the light-emitting diode surrounded thereby which increases when getting away from the support face of the substrate according to the transverse direction and having, over an upper portion of the height thereof located on the side opposite to the support face of the substrate with respect to said lower portion, a thickness considered transversely to the longitudinal axis of the light-emitting diode surrounded thereby which decreases at the level of the upper border of the light-emitting diode when getting away from the support face of the substrate according to the transverse direction and wherein the light confinement walls have an inner face having a concave shape matching with said convex shape and directed towards the light-emitting diode for which it confines the light radiation thereof.

Some preferred, yet non-limiting, aspects of this optoelectronic device are as follows.

The light confinement walls cover the upper border of the light-emitting diodes and the light radiation originating from the light-emitting diodes is emitted out of the optoelectronic device by an emission surface of the optoelectronic device located, with respect to the light-emitting diodes, on the side opposite to the upper borders of the light-emitting diodes according to the transverse direction.

The second material is such that the light confinement walls are reflective for the light radiation originating from the light-emitting diodes.

The optoelectronic device comprises a lower electrode layer made of an electrically-conductive material transparent to the light radiation, said lower electrode layer being in electrical contact with the lower borders of the light-emitting diodes in order to fill a function of a first electrode common to several light-emitting diodes.

Each light-emitting diode is of the core-shell type and the optoelectronic device comprises an upper electrode layer made of an electrically-conductive material transparent to the light radiation, the upper electrode layer directly covering the lateral sidewalls and the upper border of the light-emitting diodes by being in contact with the latter so as to fill a function of a second electrode common to several light-emitting diodes, the spacing walls directly covering the lateral sidewalls and the upper border of the upper electrode layer by being in contact with the latter and the upper electrode layer being in electrical contact with at least one of the light confinement walls.

The light confinement walls do not cover the upper border of the light-emitting diodes and the light radiation originating from the light-emitting diodes is emitted out of the optoelectronic device by an emission surface of the optoelectronic device located, with respect to the light-emitting diodes, on the side of the upper borders of the light-emitting diodes according to the transverse direction.

BRIEF DESCRIPTION OF THE DRAWINGS

Other aspects, objects, advantages and features of the invention will appear better on reading the following detailed description of preferred embodiments thereof, provided as a non-limiting example, and made with reference to the appended drawings in which.

DETAILED DISCLOSURE OF PARTICULAR EMBODIMENTS

Figure 1:
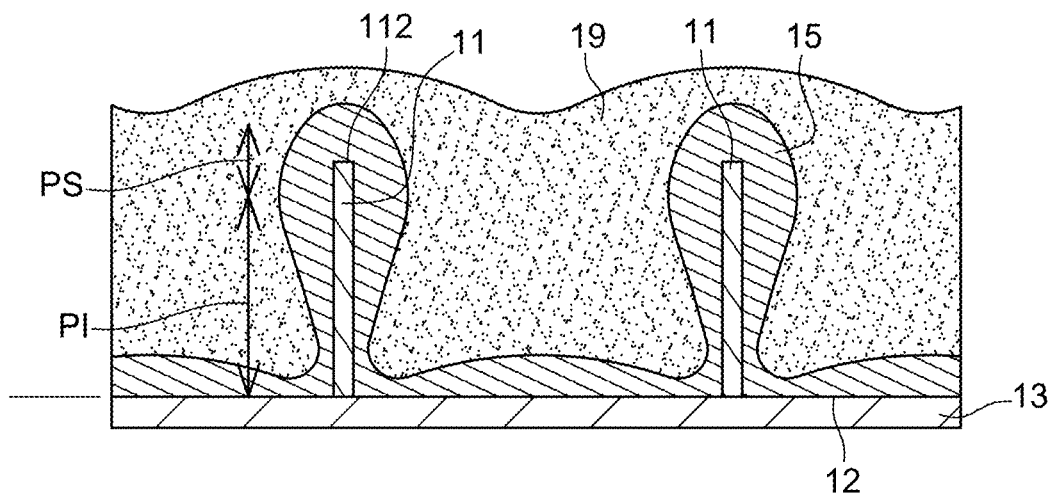
FIGS. 1 and 2 illustrate two steps of an example of implementation of a manufacturing method according to the invention.

In the figures and in the following description, the same reference numerals represent identical or similar elements. In addition, the different elements are not represented to scale so as to enhance clarity of the figures. Moreover, the different embodiments and variants do not exclude one another and may be combined together.

First, the invention relates to a manufacturing method for manufacturing an optoelectronic device 10 including an array of light-emitting diodes 11. It also relates to an optoelectronic device 10 as such, including the array of light-emitting diodes 11.

Thanks to the arrangement of such an array of light-emitting diodes 11, a particularly targeted application is the supply of an images display screen or of an images projection device.

To this end, the array of light-emitting diodes 11 may have a determined emission surface throughout which is transmitted the light radiation originating from the light-emitting diodes 11. In practice, the array of light-emitting diodes 11 defines an array of light pixels where each pixel includes one or several light-emitting diode(s) 11. In particular, each pixel may comprise:

- at least one sub-pixel formed by at least one light-emitting diode 11 adapted to directly generate, or to transmit via a suitable light converter, blue light,
- at least one sub-pixel formed by at least one light-emitting diode 11 adapted to directly generate, or to transmit via a suitable light converter, green light,
- at least one sub-pixel formed by at least one light-emitting diode 11 adapted to directly generate, or to transmit via a suitable light converter, red light.

The manufacturing method comprises a step of forming the array of light-emitting diodes 11 on a support face 12 of a substrate 13.

To facilitate understanding, a three-dimensional direct reference frame (X, Y, Z) is defined herein and for the following description, where the plane (X, Y) corresponds to the main plane of the optoelectronic device 10 over which the light-emitting diodes 11 are distributed and where Z corresponds to the transverse direction of the optoelectronic device 10 directed transversely to the plane (X, Y). In other words, the directions X and Y are generally directed parallel to the general plane of the support face 12 of the substrate 11 used in the manufacture of the optoelectronic device 10 and the transverse direction Z is directed transversely to the support face 12 of the substrate 13.

During this step, each formed light-emitting diode 11 advantageously has an elongate wire-like shape according to a longitudinal axis extending according to the transverse direction Z of the optoelectronic device 10.

The layout of each light-emitting diode 11 in the form of a wire is quite advantageous for high-resolution and high-contrast optoelectronic devices 10 while imposing no limitation with regards to the materials and to the techniques used in the following steps of the manufacturing method and conferring all known advantages with regards to resort to such wire-like shaped light-emitting diodes 11, in particular in terms of the cost and effectiveness.

The techniques implemented to form the wire-like shaped light-emitting diodes 11 are not restrictive with regards to the manufacturing method described in this document so that in order to implement this step of forming the light-emitting diodes 11, those skilled in the art could resort to any known techniques.

In a way that is not illustrated in detail, each light-emitting diode 11 comprises semiconductor elements including a first doped portion, an active portion and a second doped portion. The semiconductor elements are arranged in a wire-like shape, according to micrometric or nanometric dimensions.

Each light-emitting diode 11 in the form of a wire may indifferently be of the core-shell type or alternatively have an axial structure where the first doped portion, the active portion and the second doped portion are stacked according to the transverse direction Z. All known techniques for these purposes may be used, in particular by exploiting epitaxial growth principles.

The cross-section of the wire-like shaped light-emitting diodes 11, considered in any plane parallel to the plane (X, Y), may have different shapes such as, for example, an oval, circular or polygonal (for example square, rectangular, triangular or hexagonal) shape.

For example, in the case of a core-shell type layout, each light-emitting diode 11 comprises a wire forming the first doped portion, whether this is of the N type or P type, extending transversely to the plane of the support face 12 of the substrate 13, and a shell covering at least the upper portion of this wire. The shell may comprise a stacking of several layers of semiconductor materials, in particular at least one layer forming the active portion covering at least the upper portion of the wire and a layer forming the second doped portion and covering the layer forming the active portion.

As example, the constitutive wires of the first doped portion may be, at least partially, formed from semiconductor materials including mostly a III-V compound, for example III-N compounds. Examples from the group III comprise gallium, indium or aluminum. Examples of III-N compounds are GaN, AlN, InGaN or AlInGaN. Other elements from the group V may also be used, for example, phosphorus, arsenic or antimony. In general, the elements in the III-V compound may be combined with different molar fractions. It should be set out that the wires may indifferently be formed from semiconductor materials including mostly a II-VI compound. The dopant may be selected, in the case of a III-V compound, from the group comprising a P-type dopant from the group II, for example magnesium, zinc, cadmium or mercury, a P-type dopant from the group IV for example carbon, or an N-type dopant from the group IV, for example silicon, germanium or selenium.

The active layer is the layer from which most of the radiation supplied by the light-emitting diode 11 is emitted. It may include means for confining the electric-charge carriers, such as quantum wells. For example, it is constituted by an alternation of GaN and InGaN layers. The GaN layers may be doped. Alternatively, the active layer may be constituted by one single InGaN layer.

The layer forming the second doped portion, P-type doped if the wires are N-type doped or N-type doped if the wires are P-type doped, may correspond to a semiconductor layer or a stacking of semiconductor layers enabling the formation of a P-N or P-I-N junction.

In general, the first doped portion of the light-emitting diodes 11 is in electrical contact with a first lower electrode and the second doped portion of the light-emitting didoes 11 is in electrical contact with a second upper electrode. These considerations will be reviewed in-depth later on only as example.

The manner for forming the first lower electrode and the second upper electrode is not restrictive and all known techniques suited for the implementation of the subsequent steps that will be described in the following description, may, on the contrary, be considered by those skilled in the art. For example, the first lower electrode may be formed by the substrate 13 itself or by a conductive layer formed on the support face 12 of the substrate 13. The first lower electrode may also be formed after the removal of the substrate 13.

Hence, it shall be emphasized that the terms «formation of the array of light-emitting diodes 11 on the support face 12» means either that the light-emitting diodes 11 are directly formed on the support face 12 by means of a mechanical and electrical contact, or the light-emitting diodes 11 are indirectly formed on the support face 12 by the interposition of at least the conductive layer intended to ensure the function of a first lower electrode.

Hence, the substrate 13 may be at least partially formed in a conductive or highly-doped semiconductor material so as to have good electric conductivity properties, for example constituted by silicon, preferably monocrystalline.

The substrate 13 may also be formed by sapphire and even by a III-V semiconductor material, for example GaN.

Alternatively, it may consist of a «Silicon On Insulator» or «SOI» type substrate.

Alternatively, the substrate 13 may be formed in a semiconductor or electrically-insulating material.

It arises from the foregoing that the first lower electrode may be formed by the substrate 13 itself or by a lower electrode layer 21, formed on the substrate 13 in an electrically-conductive material and in electrical contact with the lower borders of the light-emitting diodes 11 in order to fill a function of a first electrode common to several light-emitting diodes 11.

Figure 5:
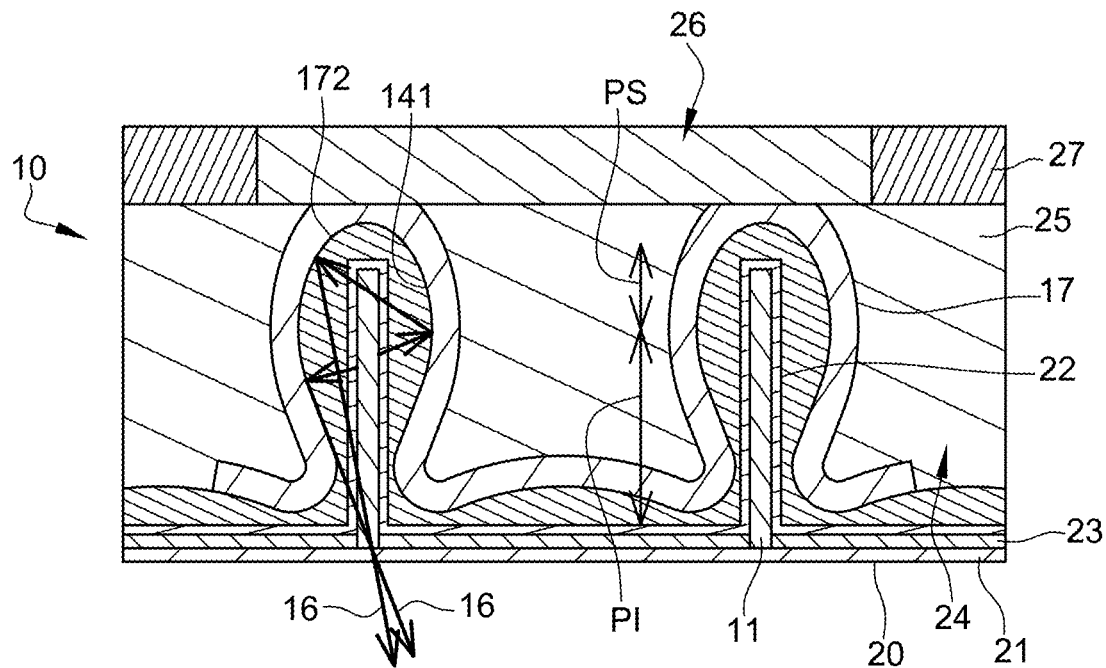
FIGS. 5 and 6 represent, in longitudinal section, two other examples of optoelectronic devices that could be obtained through the implementation of a manufacturing method according to the invention.
Figure 6:
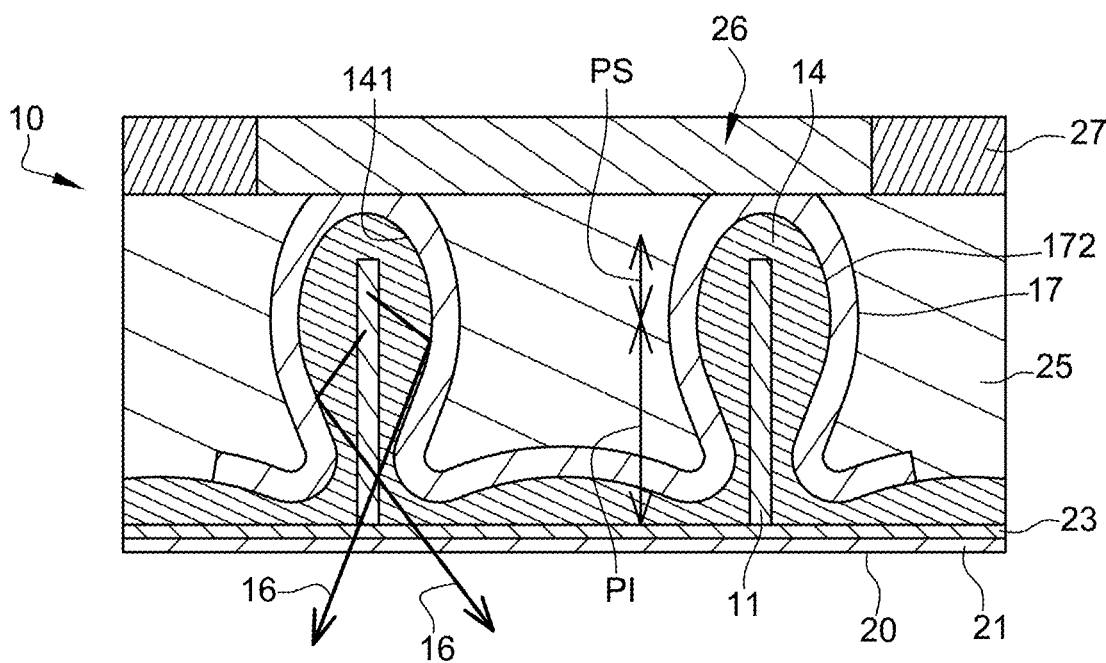

In the case where an emission of light will be desired at the rear face of the optoelectronic device 10, as is the case for example in the embodiments of FIGS. 5 and 6, the lower electrode layer 21 may be transparent to the light radiation 16 originating from the light-emitting diodes 11 (it is set out that in this embodiment, the substrate 13 on which the light-emitting diodes 11 are formed is removed and the lower electrode layer 21 is formed after the removal of the substrate 13). But it is specified that this condition of transparency of the layer 21 to the light radiation 16 is not mandatory, in particular in the case where it would be desired that the emission of light is achieved on the side of the front face of the optoelectronic device 10.

It is possible to provide for a layer of an electrically-insulating material between the substrate 13 and the lower electrode layer 21, for example depending on the nature of the substrate 13, such an electrically-insulating material layer remaining, nonetheless, optional.

The lower electrode layer 21 may comprise a nucleation layer or a stacking of nucleation layers made of a material suited to the growth, on said material, of the semiconductor elements of the light-emitting diodes 11.

As example, the material composing a nucleation layer may consist of a nitride, a carbide or a boride of a transition metal from the column IV, V or VI of the periodic table of elements or a combination of these compounds. As example, the nucleation layer may be made of aluminum nitride, aluminum oxide, boron, boron nitride, titanium, titanium nitride, tantalum, tantalum nitride, hafnium, hafnium nitride, niobium, niobium nitride, zirconium, zirconium boride, zirconium nitride, silicon carbide, tantalum nitride and carbide, or magnesium nitride in the form $Mg_xN_y$, where x is equal to about 3 and y is equal to about 2, for example magnesium nitride in the form $Mg_3N_2$. The nucleation layer may be doped with the same conductivity type as that of the semiconductor elements intended to grow, and have a thickness comprised, for example, between 1 nm and 200 nm, preferably comprised between 10 nm and 50 nm. The nucleation layer may be composed of an alloy or of a stacking of one or several material(s) mentioned in the list hereinabove.

The lower electrode layer 21 may comprise, besides the nucleation layer(s) or instead of the nucleation layer(s), a conductive layer or a stacking of conductive layers, in particular metallic.

In the case where an emission of light is desired on the side of the front face of the optoelectronic device 10, the conductive layer(s) may cover the nucleation layer(s) between the light-emitting diodes 11 but without extending over the light-emitting diodes 11. For example, the conductive material used for such conductive layers is: aluminum, copper, gold, ruthenium, silver, zinc, titanium, nickel. In particular, properties enabling it to serve as a reflector to send back outwards the light radiations 16 initially emitted by the light-emitting diodes 11 in the direction of the substrate 13, may be desired.

In the case where an emission of light is desired on the side of the rear face of the optoelectronic device 10, the conductive material used for such conductive layers may have transparency characteristics to the light emitted by the light-emitting diodes 11. For example, the used material may be selected from any transparent conductive oxides, also known under the acronym «TCO». In particular, it may be provided for forming the conductive layer(s), for example by deposition, after a step of removing the substrate 13 and removing the nucleation layer(s).

Figure 4:
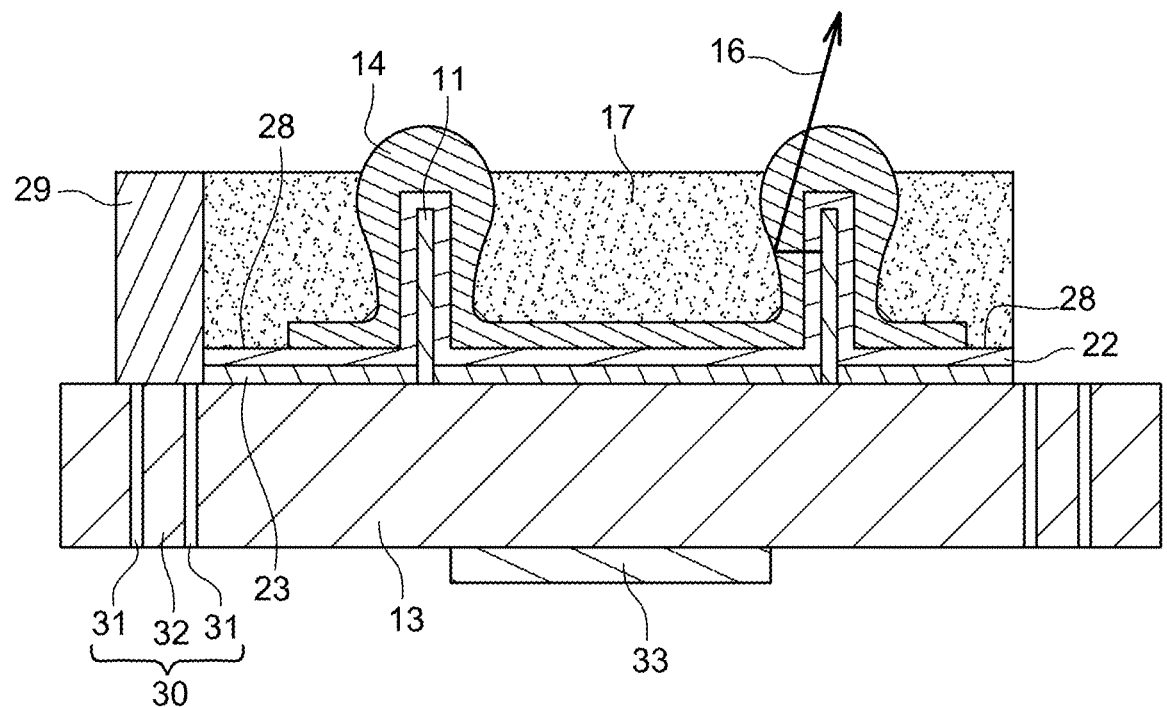
FIG. 4 represents, in longitudinal section, another example of an optoelectronic device that could be obtained through the implementation of a manufacturing method according to the invention.

Afterwards, the manufacturing method comprises a step of forming spacing walls 14 made of a first material that is both dielectric and transparent to the light radiation 16 (this light radiation being schematized by arrows undergoing a reflection in FIGS. 4 to 6) originating from the light-emitting diodes 11. The spacing walls 14 are formed so that the lateral sidewalls 111 of each light-emitting diode 11, over the entire height H thereof considered according to the transverse direction Z, are surrounded by at least one of the spacing walls 14. As example, the height H of the light-emitting diodes 11 is comprised between 0.1 and 100 μm, preferably between 0.5 and 20 μm.

Hence, the first material used for the formation of the spacing walls 14 has properties of transparency to the wavelengths intended for the light radiations 16 originating from the active portions of the light-emitting diodes 11 and, at the same time, electrical insulation properties. For example, it may consist of an oxide, a nitride and even, for example, a silicon oxynitride. Other materials may also be suitable, such as for example organic materials, some resins or silicones, $TiO_2$ or $HfO_2$.

The first material used for the formation of the spacing walls 14 may include photo-luminescent particles, adapted to convert the light radiation 16 emitted by the light-emitting diodes 11 in terms of wavelengths, in order to ultimately modify the color of the light emitted out of the optoelectronic device 10. This solution may be used to obtain pixels or sub-pixels of different colors without resorting to other additional color converters.

Preferably, the photo-luminescent particles are in the form of quantum dots, that is to say in the form of semiconductor nanocrystals whose quantum confinement is substantially three-dimensional. The average size of the quantum dots may then be comprised between 0.2 nm and 50 nm, for example between 1 nm and 30 nm. The quantum dots may be made of at least one semiconductor compound, which may be selected from cadmium selenide (CdSe), indium phosphide (InP), gallium and indium phosphide (InGaP), cadmium sulphide (CdS), zinc sulphide (ZnS), cadmium (CdO) or zinc (ZnO) oxide, zinc and cadmium selenide (CdZnSe), zinc selenide (ZnSe) doped for example with copper or manganese, graphene or from other possibly suitable semiconductor materials. The size and the composition of the photo-luminescent particles are selected according to the desired luminescence wavelength. It may also consist of core-shell type structures.

As shown in the different variants schematized in FIGS. 1 to 6, the step of forming the spacing walls 14 is implemented so that the formed spacing walls 14 have a convex-shaped outer face and so that at least one of said spacing walls 14 has, over a lower portion (denoted «PI») of the height thereof considered according to the transverse direction Z located on the side of the support face 12 of the substrate 13, a thickness considered transversely to the longitudinal axis of the light-emitting diode 11 surrounded thereby which increases when getting away from the support face 12 of the substrate 13 according to the transverse direction Z and which has, over an upper portion (denoted «PS») of the height thereof located on the side opposite to the support face 12 of the substrate 13 with respect to said lower portion PI, a thickness considered transversely to the longitudinal axis of the light-emitting diode 11 surrounded thereby which decreases at the level of the upper border 112 of the light-emitting diode 11 when getting away from the support face 12 of the substrate 13 according to the transverse direction Z. The formed light confinement walls 17 have an inner face 172 having a concave shape matching with said convex shape and directed towards the light-emitting diode 11 for which it confines the light radiation 16 thereof.

On completion of their formation step, the spacing walls 14 are arranged so as not to cover the upper borders 112 of the light-emitting diodes 11.

According to a non-limiting particular mode of implementation of the manufacturing method, the step of forming the spacing walls 14 comprises a step of depositing a thin layer 15 of the first material, implemented so that the deposited thin layer 15 covers the lateral sidewalls and the upper border 112 of the light-emitting diodes 11. The thin layer 15 may directly cover the lateral sidewalls and the upper borders 112 of the light-emitting diodes 11 by being in contact with the latter. Alternatively, the thin layer 15 may cover them indirectly through the interposition of at least one intermediate layer such as for example at least one thin layer of a conductive material transparent to the light radiations 16 intended to serve as a second upper electrode. For example, these arrangements are represented in FIG. 5 with the presence of the layer bearing the reference numeral 22 which will be described in more detail in the following description.

The thin layer 15 may be deposited by chemical vapor deposition, for example by atomic layer deposition, and even by physical vapor deposition, for example by electron beam, by cathode sputtering, or the same.

In general, the thin layer 15 has an average thickness (this average thickness being substantially homogeneous in the particular embodiment providing for a conformal deposition of the material) which may be comprised between 100 nm and 10 µm, and preferably between 500 nm and 5 µm, for example comprised between 1 µm and 2 µm, at the level of the lateral sidewalls of the light-emitting diodes 11.

In particular, the thickness of the thin layer 15 may result from a tradeoff between its function of self-aligning the light confinement walls 17 described later on, and the output of the best possible resolution.

Thus, the thin layer 15 may continuously cover the lateral sidewalls of the light-emitting diodes 11, their upper borders 112 and the areas between the light-emitting diodes 11.

In the second example of implementation of the manufacturing method represented in the figures, the deposition of the thin layer 15 is performed in a non-conformal way, meaning that the thickness of the thin layer 15 has large variations after deposition. In particular, the thickness of the thin layer 15 decreases progressively as it approaches the link area between the light-emitting diodes 11 and the substrate 13, that is to say at the level of their lower borders. This progressive decrease is performed along the lateral sidewalls of the light-emitting diodes 11 as well as along the areas separating the light-emitting diodes 11 from one another.

The spacing walls 14 may cover, whether directly or indirectly, the upper borders 112 of the light-emitting diodes 11, as is for example the case in FIGS. 1 to 4. The spacing walls 14 will essentially correspond to the formed thin layer 15.

The manufacturing method comprises a step of forming light confinement walls 17 made of a second material adapted to block the light radiation 16 originating from the light-emitting diodes 11. By «block the light radiation», it should be understood that either the material absorbs the incident light radiation so that it does not cross this material, or the material has properties of reflection of the incident light radiation on this material.

The formed light confinement walls 17 directly cover the lateral sidewalls 141 of the spacing walls 14 by being in contact with the latter, so that the light radiation 16 originating from each light-emitting diode 11 and directed in the direction of the adjacent light-emitting diodes 11 is blocked (by absorption or reflection) by the light confinement wall 17 which covers the spacing wall 14 that surrounds this light-emitting diode 11.

By «light radiation 16 originating from the light-emitting diodes 11», it should be understood that it either consists of the light radiations directly emitted by the light-emitting diodes 16, or it consists of the light radiations converted by possible color converters, for example through photo-luminescent particles in the first material used for the formation of the spacing walls 14.

The presence of such light confinement walls 17 allows avoiding the light radiations 16 originating from the light-emitting diodes 11 being mixed from one light-emitting diode 11 to another in order to be able to ensure a high contrast.

In other words, while it possible to provide for the second material used in the step of forming the light confinement walls 17 to be opaque only to the light radiations 16 originating from the light-emitting diodes 11, it is quite advantageous to guarantee that this second material is such that the light confinement walls 17 are reflective to the light radiations 16 originating from the light-emitting diodes 11. This allows increasing the efficiency of the set and possibly achieving an emission of the light radiations 16 out of the optoelectronic device 10 on the side of the rear face after removal of the substrate 13.

The second material having such reflective properties with regards to the light radiations 16 may be made of the same reflective material or of a plurality of different materials deposited on top of one another. The reflective materials may be selected from aluminum, silver, nickel, platinum, or any other suitable material.

In general, any technique may be considered by those skilled in the art to form such light confinement walls 17.

According to a non-limiting particular mode of implementation of the manufacturing method, with reference to FIG. 1, the step of forming the light confinement walls 17 comprises a step of depositing a thin layer 19 of the second material implemented so that this thin layer 19 of the second material covers not only the lateral sidewalls 141 of the spacing walls 14 by being in direct contact with the latter but also the upper borders 112 of each of the light-emitting diodes 11 by being in contact, or not (for example in the case where the upper borders 112 are already covered by the layer forming the second upper electrode and/or by a portion of the spacing walls 14), with it.

As illustrated in FIG. 1, the step of depositing the thin layer 19 of the second material may, for example, comprise a step of filling, by this thin layer 19 of the second material, the empty spaces delimited between the spacing walls 14 at the level of the areas between the light-emitting diodes 11.

Nonetheless, the deposition of the thin layer 19 may be carried out by any technique known to those skilled in the art, the choice may depend for example on the nature of the deposited material, its thickness or on the voids externally separating the spacing walls 14. The thickness of the deposited thin layer 19 may be sufficiently larger than the height H of the light-emitting diodes 11 so as to ensure, where necessary, the second material being able to cover the upper borders 112 of the light-emitting diodes 11, in the case where a reflection of the light radiations 16 is desired at this location. Yet, as shown in FIG. 5, it is possible to ensure that the thin layer intended to form the light confinement walls 17 covers the upper borders 112 of the diodes 11 despite a thickness of this thin layer being substantially smaller than H.

The example of implementation of the manufacturing method illustrated in FIGS. 1 and 1 also provides for the deposition of the thin layer 19 (FIG. 1) between and over the spacing walls 14 formed beforehand through a deposition promoting an irregular thickness as already explained. At the contact with the spacing walls 14, the thin layer 19 has a shape matching with the spacing walls 14 by conforming to their external shapes. The result is that the same will apply to the light confinement walls 17 obtained subsequently to the deposition of the thin layer 19. The thin layer 19 then covers the lateral sidewalls and the upper borders of the spacing walls 14 which, in turn, cover the upper borders 112 and the lateral sidewalls of the light-emitting diodes 11.

In the case where the extraction of the emitted light is desired by the front face of the optoelectronic device 10, that is to say on the side opposite to the substrate 13 having been used for the manufacture, the manufacturing method will be carried out so that on completion of the step of forming the light confinement walls 17, the upper border 112 of each light-emitting diode 11 is not covered by the second material so that the light radiation 16 originating from the light-emitting diodes 11 is emitted out of the optoelectronic device 10 by an emission surface of the optoelectronic device 10 located, with respect to the light-emitting diodes 11, on the side of the upper borders 112 of the light-emitting diodes 11 according to the transverse direction Z.

Figure 2:
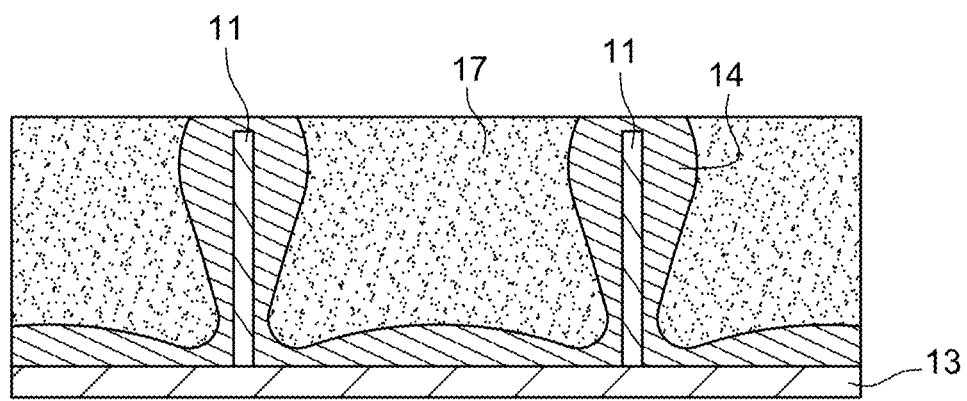
Figure 3:
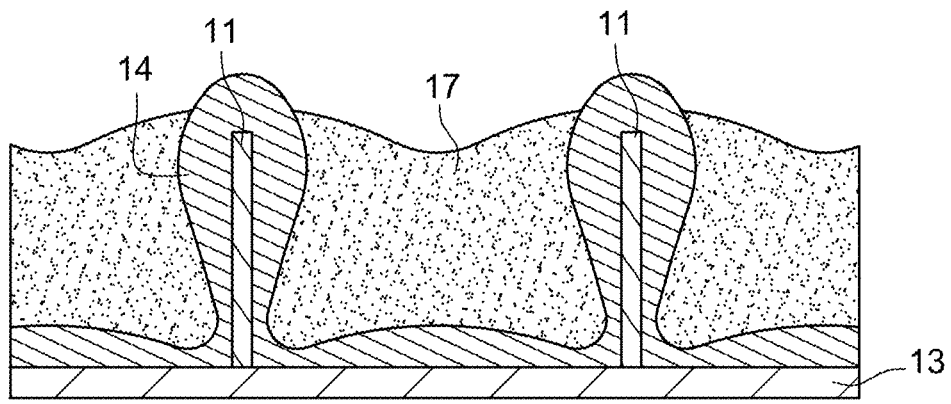
FIG. 3 illustrates a variant of FIG. 2.

Thus, after the step of depositing the thin layer 19 of the second material, in order to end up with the configuration of FIGS. 2 to 4, the step of forming the light confinement walls 17 may comprise an optional step of etching and/or a step of chemical-mechanical polishing the thin layer 19 of the second material deposited beforehand, on the side opposite to the substrate 13 according to the transverse direction Z. This etching and/or chemical-mechanical polishing step may be implemented by any technique known to those skilled in the art. In particular, when desired, an object of this step is to ensure that the light confinement walls 17 do not cover the upper borders 112 of the light-emitting diodes 11, in particular in order to allow emitting the light radiations 16 out of the optoelectronic device 10 by the front face.

While FIG. 2 illustrates an example wherein a planarization of the previously-deposited thin layer 19 is carried out by etching or chemical-mechanical polishing until removing all of the second material on top of the upper borders 112 of the light-emitting diodes 11, these upper borders 112 being still covered by the first material corresponding to the spacing wall 14 (the light confinement walls 17 only covering the lateral sidewalls of the spacing walls 14), FIG. 3 schematizes the variant of FIG. 2 which corresponds to the particular case where the step of etching the thin layer 19 is a selective etching, meaning that the second material is etched and the first material remains substantially intact (in other words, the shape of the spacing walls 14 is identical at the level of the upper borders 112 of the light-emitting diodes 11 whether before or after said step of etching the thin layer 19).

In the manufacturing method that has just been described, the spacing walls 14 over which the light confinement walls 17 are directly formed ensure, quite advantageously, a function of self-aligning the formed light confinement walls 17. Since the spacing walls 14 are, in turn, formed aligned with respect to the light-emitting diodes 11 surrounded thereby, this results in an advantageous phenomenon of self-alignment of the light confinement walls 17 with respect to the light-emitting diodes 11. This allows obtaining quite accurately aligned light confinement walls 17 even in the case of light-emitting diodes 11 that are spaced apart according to a very small step in the plane (X, Y). The result is the possibility of providing an optoelectronic device 10 having both a high contrast (thanks to the presence of the light confinement walls 17) and a high resolution, in a simple and economical manner.

By providing for the step of forming the light confinement walls 17 to comprise the deposition of the thin layer 19 as previously described, that is to say in particular where the thin layer 19 directly covers the lateral sidewalls 141 of the spacing walls 14 by being in contact with the latter and covers the upper border 112 of the light-emitting diodes 11, it is possible to provide a solution that is simple, non-restrictive and economical to implement yet without altering in any manner whatsoever the obtained contrast and resolution levels.

The particular shapes of the previously-described spacing walls 14, that is to say featuring a progressive increase in thickness along the lower portion PI and a progressive decrease along the upper portion PS as described hereinbefore, are advantageous for the emitted light to undergo a collimation within a reduced cone, such as for example a light beam opening characterized by a value NA (standing for «Numerical Aperture») in the range of 0.3. The effect of such concave shapes of the reflective inner faces 172 is even more effective for a wire-like shaped light-emitting diode 11 in order to ensure the collimation of the emitted light so as to be partially emitted parallel to the axis of the wire-like shaped first doped portions of the light-emitting diodes 11, while such light-emitting diodes 11 intrinsically have a heart-like shaped far field.

Figure 7:
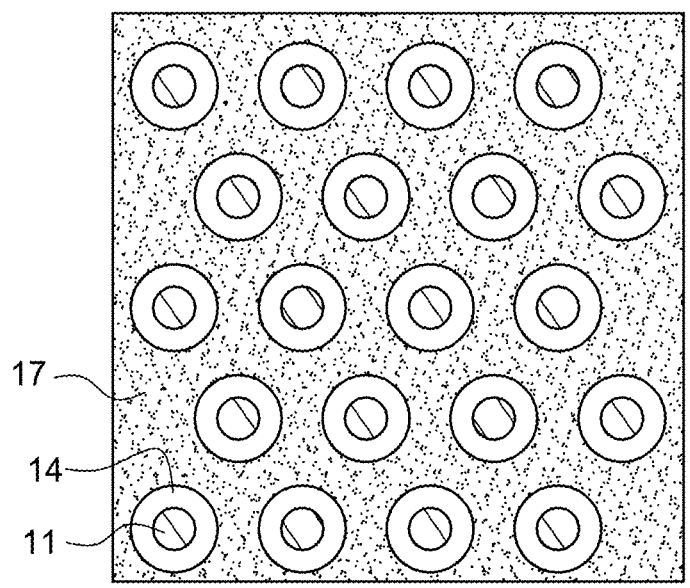
FIGS. 7 and 8 represent, in top view, two examples of optoelectronic devices manufactured through the implementation of a manufacturing method according to the invention.
Figure 8:
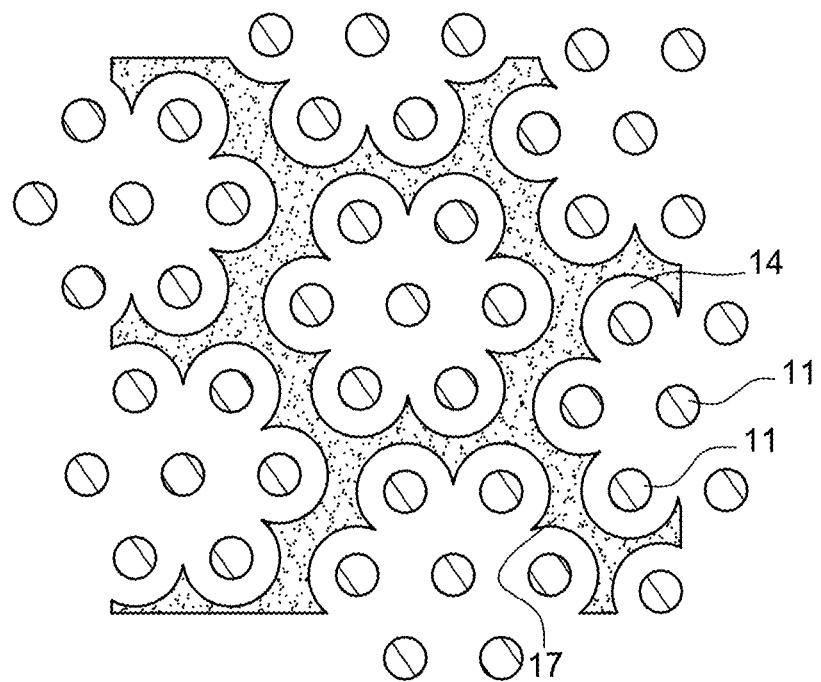

FIGS. 7 and 8 represent, in partial top view, two examples of optoelectronic devices 10 manufactured through the implementation of the previously-described manufacturing method. While FIG. 7 shows that the formed light confinement walls 17 may be such that the light-emitting diodes 11 are separate and made individual, FIG. 8 illustrates the fact that the monitoring of the thickness of the spacing walls 14 formed at the level of the lateral sidewalls 112 of the light-emitting diodes 11 and the monitoring of the step between the light-emitting diodes 11 allow making light confinement walls 17 for sub-pixels with several light-emitting diodes 11. In particular, by locally adapting the step between the light-emitting diodes 11 appropriately, it is possible to obtain a coalescence of the spacing walls 14 for some light-emitting diodes 11, as shown in FIG. 8 in contrast with FIG. 7.

Optionally, after the step of forming the light-emitting walls 17, the method comprises a step of removing the first material that has been used in the temporary constitution of the spacing walls 14. While the created voids could possibly be left empty once this removal is completed, it may be considered to provide for an additional step consisting in filling the voids created by the removal of the first material with a third filler material. For example, the third filler material may be constituted by a silicone material or by a material adapted to ensure a light converter function. Any material that is suited to this function may be considered by those skilled in the art.

When the extraction of the emitted light is desired to occur by the rear face of the optoelectronic device 10, that is to say on the side of the base of the light-emitting diodes 11 opposite to their upper borders 112, the manufacturing method is carried out so that at the end of the step of forming the light confinement walls 17, the upper border 112 of each light-emitting diode 11 is also covered (directly as is the case in FIG. 6; or indirectly as is the case in FIG. 5) by a light confinement wall 17 so that after the implementation of a step of removing the substrate 13, the light radiation 16 originating from the light-emitting diodes 11 is emitted out of the optoelectronic device 10 by an emission surface 20 of the optoelectronic device 10 located, with respect to the light-emitting diodes 11, on the side opposite to the upper borders 112 of the light-emitting diodes 11 according to the transverse direction Z. These are for example the configurations of FIGS. 5 and 6.

In each of FIGS. 5 and 6, in which one single pixel is represented for merely illustrative purposes, the optoelectronic device 10 therefore comprises:

an array of light-emitting diodes 11 where each light-emitting diode 11 features the previously-described wire-like shape, that is to say elongate according to a longitudinal axis extending according to the transverse direction Z of the optoelectronic device 10, the spacing walls 14 made of the first material as previously described, arranged such that the lateral sidewalls of each light-emitting diode 11, over the entire height H thereof, are surrounded by at least one of these spacing walls 14, and the light confinement walls 17 made of the second material as previously described, and directly covering the lateral sidewalls 141 of the spacing walls 14 by being in contact with the latter and covering the upper border 112 of the light-emitting diodes 11.

In each of the examples of FIGS. 5 and 6, the spacing walls 14 have a convex-shaped outer face, at least one of said spacing walls 14 having, over a lower portion PI of the height thereof considered according to the transverse direction Z located on the side of the support face 12 of the substrate 13, a thickness considered transversely to the longitudinal axis of the light-emitting diode 11 surrounded thereby which increases when getting away from the support face 12 of the substrate 13 according to the transverse direction Z and having, over an upper portion PS of the height thereof located on the side opposite to the support face 12 of the substrate 13 with respect to said lower portion PI, a thickness considered transversely to the longitudinal axis of the light-emitting diode 11 surrounded thereby which decreases at the level of the upper border 112 of the light-emitting diode 11 when getting away from the support face 12 of the substrate 13 according to the transverse direction Z and the light confinement walls 17 have an inner face 172 having a concave shape matching with said convex shape and directed towards the light-emitting diode 11 for which it confines the light radiation 16 thereof. The entirety of the convex surface delimited by the spacing walls 14 is covered by the light confinement walls 17.

The light confinement walls 17 that cover the lateral sidewalls of the light-emitting diodes 11 enable the light radiation 16 originating from each light-emitting diode 11 and directed in the direction of the adjacent light-emitting diodes 11 to be blocked by the light confinement wall 17 that covers the spacing wall 14 which surrounds this light-emitting diode 11. At the same time, since the light confinement walls 17 also cover the upper borders 112 of the light-emitting diodes 11, the light radiation 16 originating from the light-emitting diodes 11 is emitted out of the optoelectronic device 10 by an emission surface 20 of the optoelectronic device 10 located, with respect to the light-emitting diodes 11, on the side opposite to the upper borders 112 of the light-emitting diodes 11 according to the transverse direction Z.

In each of the examples of FIGS. 5 and 6, the aforementioned lower electrode layer 21, formed after removal of the substrate 13, is transparent to the light radiation 16 originating from the light-emitting diodes 11. The lower electrode layer 21 is in electrical contact with the lower borders of the light-emitting diodes 11 so that the first lower electrode is common to several light-emitting diodes 11. Thus, subsequently to the formation of the light-emitting diodes 11, the spacing walls 14 and the confinement walls 17, the manufacturing method comprises a step of removing the substrate 13 then a step of forming the lower electrode layer 21, typically by deposition, over the face cleared after the removal of the substrate 13. For example, the material used for the formation of the lower electrode layer 21 may be selected from any transparent conductive oxides, also known under the acronym «TCO».

To obtain the optoelectronic device 10 of FIG. 5, at least one insulating layer 23 is formed on the upper face of the substrate 13 before the formation of the light-emitting diodes 11, said at least one insulating layer 23 allowing avoiding an electrical contact between the lower electrode layer 21 and the upper electrode layer 22.

In FIG. 5, each light-emitting diode 11 is of the core-shell type. These light-emitting diodes 11 are obtained, for example, by epitaxial growth starting from a continuous nucleation layer or from nucleation pads distributed over the substrate 13, in the insulating layer 23. The optoelectronic device 10 also comprises the upper electrode layer 22 made of an electrically-conductive material transparent to the light radiation emitted by the light-emitting diodes 11. The upper electrode layer 22, where the material used therein may be selected from any transparent conductive oxides TCO known to those skilled in the art, directly covers the lateral sidewalls and the upper border 112 of the light-emitting diodes 11 by being in contact with the latter so as to constitute a second upper electrode common to several light-emitting diodes 11. Afterwards, the spacing walls 14 directly cover the lateral sidewalls and the upper border of the upper electrode layer 22 by being in contact with the latter. Then, the light confinement walls 17 are formed. The upper electrode layer 22 is in electrical contact with at least one of the light confinement walls 17 which are formed on the spacing walls 14, in particular in the upper portion thereof. The substrate 13 is removed and then the lower electrode layer 21 is formed on said at least one insulating layer 23 and so as to be in contact with the lower borders of the light-emitting diodes. The indentation, bearing the reference numeral 24, allows illustrating the etching undergone by the second material by the front face thereof, to insulate the second upper electrodes from one sub-pixel to another. The light confinement walls 17 are externally embedded within a first insulating layer 25, over which the power supply and control device 26 is formed by means of an electrical contact between this device 26 and the upper portions of the light confinement walls 17. In turn, the power supply and control device 26 is embedded within a second insulating layer 27. Any technique for forming the power supply and control device 26, the first insulating layer 25 and the second insulating layer 27 may be considered.

It shall be understood that in the optoelectronic device 10 of FIG. 5, the light confinement walls 17, thanks to their conductive properties, are part of the constitution of the second upper electrode complementarily with the upper electrode layers 22 which, in turn, are directly in contact with the second doped portions of the shell of the light-emitting diodes 11. These participate in the electrical connection with the power supply and control device 26.

The optoelectronic device 10 of FIG. 6 is substantially identical to that of FIG. 5 with the exception that each light-emitting diode 11 has, in this instance, an axial structure and that the upper electrode layer 22 is absent because of the axial structure of the light-emitting diodes 11. In this instance, the electrically-insulating layer 23 formed on the lower electrode layer 21 allows avoiding an electrical contact between the lower electrode layer 21 and the light confinement walls 17 which, alone, fill the function of a second upper electrode. It is actually the second doped portions of the light-emitting diodes 11 that are in direct contact with the light confinement walls 17, at the level of the upper borders 112 of the light-emitting diodes 11.

As example, the convex shapes delimited by the spacing walls 14 may be parabolic, so that the light confinement walls 17 then have a complementary concave parabolic shape, as is the case in each of FIGS. 5 and 6. It is then quite advantageous, in the case of light-emitting diodes 11 having an axial structure, to ensure, through an adapted monitoring of the conditions of formation of the spacing walls 14, that this concave parabola is shaped such that the active portion of the light-emitting diode 11 adapted to emit the light radiation 16 is located at the focus of the concave parabola.

Nonetheless, the spacing walls 14 may have convex shapes other than parabolic.

In the example of optoelectronic device 10 of FIG. 4, unlike the arrangements of FIGS. 5 and 6, the light confinement walls 17 do not cover the upper border 112 of the light-emitting diodes 11 so that the light radiation 16 originating from the light-emitting diodes 11 is emitted out of the optoelectronic device 10 by an emission surface of the optoelectronic device 10 located, with respect to the light-emitting diodes 11, on the side of the upper borders 112 of the light-emitting diodes 11 according to the transverse direction Z.

In FIG. 4, in which only two light-emitting diodes 11 are represented for merely illustrative purposes, the optoelectronic device 10 therefore comprises:
  an array of light-emitting diodes 11 where each light-emitting diode 11 features the previously-described wire-like shape, that is to say elongate according to a longitudinal axis extending according to the transverse direction Z of the optoelectronic device 10,
  the spacing walls 14 made of the first material as previously described, arranged such that the lateral sidewalls of each light-emitting diode 11, over the entire height H thereof, are surrounded by at least one of these spacing walls 14,
  and the light confinement walls 17 made of the second material as previously described, and directly covering the lateral sidewalls 141 of the spacing walls 14 by being in contact with the latter but without covering the upper border of the light-emitting diodes 11.

In the example of FIG. 4, the spacing walls 14 have a convex-shaped outer face, at least one of said spacing walls 14 having, over a lower portion PI of the height thereof considered according to the transverse direction Z located on the side of the support face 12 of the substrate 13, a thickness considered transversely to the longitudinal axis of the light-emitting diode 11 surrounded thereby which increases when getting away from the support face 12 of the substrate 13 according to the transverse direction Z and having, over an upper portion PS of the height thereof located on the side opposite to the support face 12 of the substrate 13 with respect to said lower portion PI, a thickness considered transversely to the longitudinal axis of the light-emitting diode 11 surrounded thereby which decreases at the level of the upper border 112 of the light-emitting diode 11 when getting away from the support face 12 of the substrate 13 according to the transverse direction Z and the light confinement walls 17 have an inner face 172 having a concave shape matching with said convex shape and directed towards the light-emitting diode 11 for which it confines the light radiation 16 thereof. Only part of the convex surface delimited by the spacing walls 14 is covered by the light confinement walls 17.

Still in the example of FIG. 4, the first lower electrode is constituted by the substrate 13 itself. The lower borders of the light-emitting diodes 11 are in contact with the substrate 13, for example throughout the nucleation layer or nucleation pads, to create the electrical contact. The substrate 13 integrates across the thickness thereof electrically-insulating elements 30 extending through the substrate 13 and delimiting, in pairs, portions of the substrate 13 that are electrically insulated from one another.

The electrically-insulating elements 30 may comprise trenches each extending across the entire thickness of the substrate 13 and filled with an electrically-insulating material, for example an oxide, in particular silicon oxide, or an insulating polymer. Alternatively, as illustrated in FIG. 4, the walls of each trench are covered with an insulating layer 31, the remainder of the trench being filled with a semiconductor or conductive material 32, for example polycrystalline silicon. According to another variant, the electrically-insulating elements 30 comprise regions doped with a polarity type opposite to the substrate 13. As example, each trench has a width larger than 1 micron. The electrically-insulating elements 30 may comprise a first series of such trenches directed according to the lateral direction Y and thus stepped along the longitudinal direction X and a second series of such trenches directed according to the longitudinal direction X and therefore stepped along the lateral direction Y. This allows reaching a matrix-like layout of the light-emitting diodes 11 in the plane of the substrate 13.

It should be set out herein that such electrically-insulating elements 30 may quite possibly be implemented even in the case where the substrate 13 is made of a semiconductor or electrically-insulating material, for heat resistance reasons.

Electrical contacts 33 that are necessary for the pixelation of the optoelectronic device 10 are formed on the rear face of the optoelectronic device 10. More specifically, the electrical contacts 33 are formed so as to be in electrical contact with the rear face of the substrate 13.

To obtain the optoelectronic device 10 of FIG. 4, at least one insulating layer 23 is formed on the upper face of the substrate 13 before the formation of the light-emitting diodes 11, said at least one insulating layer 23 allowing avoiding an electrical contact between the substrate 13 and the upper electrode layer 22.

In FIG. 4, each light-emitting diode 11 is for example obtained by epitaxial growth starting from a continuous nucleation layer or from nucleation pads distributed over the substrate 13, in openings of the insulating layer 23. The optoelectronic device 10 also comprises the upper electrode layer 22 made of an electrically-conductive material transparent to the light radiation emitted by the light-emitting diodes 11. The upper electrode layer 22, the material used therein may be selected from any transparent conductive oxides TCO known to those skilled in the art, directly covers the lateral sidewalls and the upper border 112 of the light-emitting diodes 11 by being in contact with the latter so as to constitute a second upper electrode common to several light-emitting diodes 11. Afterwards, the spacing walls 14 directly cover the lateral sidewalls and the upper border of the upper electrode layer 22 by being in contact with the latter. Then, the light confinement walls 17 are formed. The upper electrode layer 22 is in electrical contact with at least one of the light confinement walls 17 that are formed on the spacing walls 14, in the interface area bearing the reference numeral 28 between the upper electrode layer 22 and the light confinement walls 17. The confinement walls 17 are discontinuous, in particular in the form of indentations obtained by etching of the second material by the front face thereof, to insulate the second upper electrodes from one sub-pixel to another. An electrically-insulating material 29 may be attached in these indentations.

In a variant of FIG. 4 that is not illustrated, where the first lower electrode is no longer constituted by the substrate 13 itself, the substrate 13 is removed and then a lower electrode layer is formed on said at least one insulating layer 23 previously formed on the substrate 13, this lower electrode layer being in contact with the lower borders of the light-emitting diodes 11. Then, electrical contacts that are necessary for the pixelation of the optoelectronic device 10 are formed on the rear face of the optoelectronic device 10. More specifically, the electrical contacts are then formed so as to be in electrical contact with the rear face of the lower electrode layer.

The invention claimed is:

1. A manufacturing method for manufacturing an optoelectronic device including an array of light-emitting diodes, including the following steps:
    formation of the array of light-emitting diodes on a support face of a substrate, this step being carried out so that each light-emitting diode of the array of light-emitting diodes has an upper border and an elongate wire-like shape according to a longitudinal axis extending according to a transverse direction of the optoelectronic device directed transversely to the support face of the substrate,
    formation of spacing walls made of a first dielectric material transparent to light radiation originating from each light-emitting diode of the array of light-emitting diodes such that lateral sidewalls of each light-emitting diode of the array of light-emitting diodes, over an entire height thereof considered according to the transverse direction, are surrounded by at least one of the spacing walls,
    formation of light confinement walls made of a second material adapted to block the light radiation originating from each light-emitting diode of the array of light-emitting diodes that directly cover lateral sidewalls of the spacing walls by being in contact with the lateral sidewalls of the spacing walls, so that the light radiation originating from each light-emitting diode of the array of light-emitting diodes and directed in a direction of at least one adjacent light-emitting diode of the array of light-emitting diodes is blocked by one of the light confinement walls that covers one of the spacing walls that surrounds a corresponding light-emitting diode of the array of light-emitting diodes,
    wherein the step of formation of spacing walls is implemented so that the spacing walls have an outer face with a convex shape and so that at least one of the spacing walls has, over a lower portion of a height thereof considered according to the transverse direction located on a side of the support face of the substrate, a thickness considered transversely to a longitudinal axis of a respective light-emitting diode of the array of light-emitting diodes surrounded by the at least one of the spacing walls which increases when getting away from the support face of the substrate according to the transverse direction and which has, over an upper portion of a height thereof located on a side opposite to the support face of the substrate with respect to the lower portion, a thickness considered transversely to the longitudinal axis of the respective light-emitting diode of the array of light-emitting diodes surrounded by the at least one of the spacing walls which decreases at the upper border of the respective light-emitting diode of the array of light-emitting diodes when getting away from the support face of the substrate according to the transverse direction and each light confinement wall has an inner face having a concave shape matching with the convex shape, and the inner face being directed towards one of the light-emitting diodes of the light-emitting diodes to confine the light radiation.

2. The manufacturing method according to claim 1, wherein the step of forming the spacing walls comprises a step of depositing a thin layer of the first dielectric material, implemented so that the deposited thin layer covers the lateral sidewalls and the upper border of each light-emitting diode of the array of light-emitting diodes.

3. The manufacturing method according to claim 2, wherein the second material used in the step of forming the light confinement walls is such that the light confinement walls are reflective for the light radiation originating from each light-emiiting diode of the array of light-emitting diodes.

4. The manufacturing method according to claim 3, wherein the step of formation of light confinement walls comprises a step of depositing a thin layer of the second material implemented so that the thin layer of the second material directly covers the lateral sidewalls of the spacing walls by being in contact with the spacing walls and covers the upper border of each light-emitting diode of the array of light-emitting diodes and the step of depositing the thin layer of the second material comprises a step of filling, by the thin layer of the second material, empty spaces delimited between the spacing walls at a level of areas between each light-emitting diode of the array of light-emitting diodes.

5. The manufacturing method according to claim 4, wherein at an end of the step of formation of the light confinement walls, the upper border of each light-emitting diode of the array of light-emitting diodes is not covered by the second material so that the light radiation originating from each light-emitting diode of the array of light-emitting diodes is emitted out of the optoelectronic device by an emission surface of the optoelectronic device located, with respect to each light-emitting diode of the array of light-emitting diodes, on a side of the upper border of each light-emitting diode of the array of light-emitting diodes according to the transverse direction.

6. The manufacturing method according to claim 5, wherein the first dielectric material used for formation of the spacing walls includes photo-luminescent particles which are in the form of quantum dots.

7. The manufacturing method according to claim 4, wherein at an end of the step of formation of the light confinement walls, the upper border of each light-emitting diode of the array of light-emitting diodes is covered by a light confinement wall so that after implementation of a step of removing the substrate, the light radiation originating from each light-emitting diode of the array of light-emitting diodes is emitted out of the optoelectronic device by an emission surface of the optoelectronic device located, with respect to each light-emitting diode of the array of light-emitting diodes, on a side opposite to the upper border of each light-emitting diode of the array of light-emitting diodes according to the transverse direction.

8. The manufacturing method according to claim 7, wherein the first dielectric material used for formation of the spacing walls includes photo-luminescent particles which are in the form of quantum dots.

9. The manufacturing method according to claim 2, wherein the step of formation of light confinement walls comprises a step of depositing a thin layer of the second material implemented so that the thin layer of the second material directly covers the lateral sidewalls of the spacing walls by being in contact with the spacing walls and covers the upper border of each light-emitting diode of the array of light-emitting diodes and the step of depositing the thin layer of the second material comprises a step of filling, by the thin layer of the second material, empty spaces delimited between the spacing walls at a level of areas between each light-emitting diode of the array of light-emitting diodes.

10. The manufacturing method according to claim 1, wherein the second material used in the step of forming the light confinement walls is such that the light confinement walls are reflective for the light radiation originating from each light-emitting diode of the array of light-emitting diodes.

11. The manufacturing method according to claim 1, wherein the step of formation of light confinement walls comprises a step of depositing a thin layer of the second material implemented so that the thin layer of the second material directly covers the lateral sidewalls of the spacing walls by being in contact with the spacing walls and covers the upper border of each light-emitting diode of the array of light-emitting diodes and the step of depositing the thin layer of the second material comprises a step of filling, by the thin layer of the second material, empty spaces delimited between the spacing walls at a level of areas between the each light-emitting diode of the array of light-emitting diodes.

12. The manufacturing method according to claim 1, wherein at an end of the step of formation of the light confinement walls, the upper border of each light-emitting diode of the array of light-emitting diodes is not covered by the second material so that the light radiation originating from each light-emitting diode of the array of light-emitting diodes is emitted out of the optoelectronic device by an emission surface of the optoelectronic device located, with respect to each light-emitting diode of the array of light-emitting diodes, on a side of the upper border of each light-emitting diode of the array of the light-emitting diodes according to the transverse direction.

13. The manufacturing method according to claim 1, wherein at an end of the step of formation of the light confinement walls, the upper border of each light-emitting diode of the array of light-emitting diodes is covered by a light confinement wall so that after implementation of a step of removing the substrate, the light radiation originating from each light-emitting diode of the array of light-emitting diodes is emitted out of the optoelectronic device by an emission surface of the optoelectronic device located, with respect to each light-emitting diode of the array of light-emitting diodes, on a side opposite to the upper border of each light-emitting diode of the array of light-emitting diodes according to the transverse direction.

14. The manufacturing method according to claim 1, wherein the first dielectric material used for formation of the spacing walls includes photo-luminescent particles which are in the form of quantum dots.

15. An optoelectronic device comprising:
an array of light-emitting diodes where each light-emitting diode of the array of light-emitting diodes has an elongate wire-like shape according to a longitudinal axis extending according to a transverse direction of the optoelectronic device,
spacing walls made of a first dielectric material transparent to light radiation originating from each light-emitting diode of the array of light-emitting diodes, the spacing wall being arranged such that lateral sidewalls of each light-emitting diode of the array of light-emitting diodes, over an entire height thereof considered according to the transverse direction, are surrounded by at least one of the spacing walls,
light confinement walls made of a second material adapted to block the light radiation originating from each light-emitting diode of the array of light-emitting diodes, the light confinement walls directly covering lateral sidewalls of the spacing walls by being in contact with the spacing walls, the light radiation originating from each light-emitting diode of the array of light-emitting diodes and directed in the direction of at least one adjacent light-emitting diode of the array of light-emitting diodes being blocked by one of the light confinement walls that covers one of the spacing walls that surrounds a corresponding light-emitting diode of the array of light-emitting diodes,
wherein the spacing walls have a convex-shaped outer face, at least one of the spacing walls having, over a lower portion of a height thereof considered according to the transverse direction located on a side of a support face of a substrate, a thickness considered transversely to a longitudinal axis of a respective light-emitting diode of the array of light-emitting diodes surrounded thereby which increases when getting away from the support face of the substrate according to the transverse direction and having, over an upper portion of the height thereof located on a side opposite to the support face of the substrate with respect to the lower portion, a thickness considered transversely to the longitudinal axis of the respective light-emitting diode of the array of light-emitting diodes surrounded thereby which decreases at a level of an upper border of the respective light-emitting diode of the array of light-emitting diodes when getting away from the support face of the substrate according to the transverse direction and the light confinement walls have an inner face having a concave shape matching with the convex-shaped outer face and directed towards one of the light-emitting diodes of the array of light-emitting diodes for which it confines the light radiation thereof.

16. The optoelectronic device according to claim 15, wherein the light confinement walls cover the upper border of each light-emitting diode of the array of light-emitting diodes and the light radiation originating from each light-emitting diode of the array of the light-emitting diodes is emitted out of the optoelectronic device by an emission surface of the optoelectronic device located, with respect to each light-emitting diode of the array of light-emitting diodes, on a side opposite to the upper border of each light-emitting diode of the array of light-emitting diodes according to the transverse direction.

17. The optoelectronic device according to claim 15, wherein the second material is such that the light confinement walls are reflective for the light radiation originating from each light-emitting diode of the array of light-emitting diodes.

18. The optoelectronic device according to claim 15, wherein the optoelectronic devices comprises a lower electrode layer made of an electrically-conductive material transparent to the light radiation, the lower electrode layer being in electrical contact with lower borders of each light-emitting diode of the array of light-emitting diodes in order to fill a function of a first electrode common to several light-emitting diodes of the array of light-emitting diodes.

19. The optoelectronic device according to claim 15, wherein each light-emitting diode of the array of light-emitting diodes is of a core-shell type and each light-emitting diode of the array of light-emitting diodes comprises an upper electrode layer made of an electrically-conductive material transparent to the light radiation, the upper electrode layer directly covering the lateral sidewalls and the upper border of each light-emitting diode of the array of light-emitting diodes by being in contact with the upper border of each light-emitting diode of the array of light-emitting diodes so as to fill a function of a second electrode common to several light-emitting diodes of the array of light-emitting diodes, the spacing walls directly covering lateral sidewalls and an upper border of the upper electrode layer by being in contact with the upper border of the upper electrode layer and the upper electrode layer being in electrical contact with at least one of the light confinement walls.

20. The optoelectronic device according to claim 15, wherein the light confinement walls do not cover the upper border of each light-emitting diode of the array of light-emitting diodes and the light radiation originating from each light-emitting diode of the array of light-emitting diodes is emitted out of the optoelectronic device by an emission surface of the optoelectronic device located, with respect to each light-emitting diode of the array of light-emitting diodes, on a side of the upper borders of each light-emitting diode of the array of light-emitting diodes according to the transverse direction.

\* \* \* \* \*